(12) United States Patent
Xiong et al.

(10) Patent No.: US 8,785,082 B2
(45) Date of Patent: Jul. 22, 2014

(54) METHOD AND APPARATUS FOR INSPECTING A REFLECTIVE LITHOGRAPHIC MASK BLANK AND IMPROVING MASK QUALITY

(75) Inventors: Yalin Xiong, Pleasanton, CA (US); Stanley E. Stokowski, Danville, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 173 days.

(21) Appl. No.: 13/417,982

(22) Filed: Mar. 12, 2012

(65) Prior Publication Data

US 2012/0238096 A1    Sep. 20, 2012

Related U.S. Application Data

(60) Provisional application No. 61/453,017, filed on Mar. 15, 2011.

(51) Int. Cl.
*G03F 1/22* (2012.01)
*G03F 1/24* (2012.01)
*G03F 1/72* (2012.01)

(52) U.S. Cl.
USPC .................................. 430/5; 716/52

(58) Field of Classification Search
CPC ............... G03F 1/22; G03F 1/24; G03F 1/72; G03F 1/82

USPC ...................... 430/5, 30, 322, 394; 716/52, 54
See application file for complete search history.

(56) References Cited

U.S. PATENT DOCUMENTS

| | | |
|---|---|---|
| 6,872,497 B1 | 3/2005 | Levinson et al. |
| 6,963,395 B2 | 11/2005 | Goldberg |
| 7,564,545 B2 | 7/2009 | Stokowski |
| 2006/0234135 A1 | 10/2006 | Hau-Riege et al. |
| 2009/0325083 A1 | 12/2009 | Okubo et al. |
| 2010/0064273 A1 | 3/2010 | Credendino et al. |
| 2011/0161893 A1* | 6/2011 | Lin et al. .......................... 716/52 |

* cited by examiner

*Primary Examiner* — Stephen Rosasco
(74) *Attorney, Agent, or Firm* — Suiter Swantz pc llo

(57) ABSTRACT

An EUV integrated circuit fabrication method and system EUV that includes blank inspection, defect characterization, simulation, pattern compensation, modification of the mask writer database, inspection and simulation of patterned masks, and patterned mask repair. The system performs blank inspection to identify defects at multiple focal planes within the blank. The mask can be relocated on the blank and alterations to the pattern can be developed to compensate for the defects prior to prior to patterning the mask. Once the mask has been patterned, the reticle is inspected to identify any additional or remaining defects that were not picked up during blank inspection or fully mitigated through pattern compensation. The patterned reticle can then be repaired prior to integrated circuit fabrication.

24 Claims, 9 Drawing Sheets

METHOD AND APPARATUS FOR INSPECTING A REFLECTIVE LITHOGRAPHIC MASK BLANK AND IMPROVING MASK QUALITY

REFERENCE TO RELATED APPLICATIONS

This application claims priority to U.S. Provisional Patent Application Ser. No. 61/453,017, filed Mar. 15, 2011, which is incorporated herein by reference.

FIELD OF THE INVENTION

This application relates to extreme ultraviolet (EUV) lithographic integrated circuit (IC) wafer fabrication and, more particularly, to a method and system for detecting and compensating for defects in EUV mask blanks prior to mask patterning, as well as detecting and repairing defects in the patterned mask (reticle), to improving IC fabrication quality.

BACKGROUND OF THE INVENTION

Extreme ultraviolet (EUV) lithographic integrated circuit (IC) fabrication involves patterning a mask onto an EUV mask blank to create a reticle that is used to etch an integrated circuit (IC) onto silicon wafers. A blank may consist of a low thermal expansion (LET) substrate with a Mo/Si multilayer that reflects 13.5 nm light, which is the wavelength used for exposing the photoresist used for producing the integrated circuit patterns onto the wafers. A patterned reticle is fabricated by printing an absorber layer over the mask blank employing an electron beam writing tool that defines reflective traces corresponding to the desired pattern for IC fabrication. When the patterned reticle is exposed to EUV light, the reflective traces defined by the mask reflect the EUV light onto the silicon wafer, where the reflected light exposes a photoresist with the pattern defined by the mask. After additional develop and etch processes, this creates an integrated circuit on the wafer. Methods and systems are needed to ensure that the reticles (patterned masks) are free from defects to minimize defects in the integrated circuits etched onto the silicon wafers.

The EUV mask blanks inevitably include some defects that can result in errors in the integrated circuits when etched onto the silicon wafers. These defects can occur at multiple levels within the blank. Prior circuit design technologies have not adequately addressed the challenges of defect detection, defect mitigation, and patterned mask repair for defects occurring at multiple levels within blanks in EUV lithographic fabrication of IC wafers. This results in the inefficient fabrication of defective wafers. There is, therefore, a need for more effective methods and systems for defect mitigation in EUV lithographic fabrication of IC wafers.

SUMMARY OF THE INVENTION

The present invention meets the needs described above through a method and system for detecting and compensating for defects in EUV mask blanks prior to mask patterning, as well as detecting and repairing defects in the reticle after mask has been patterned, to improving IC fabrication quality. The invention combines the aspects of blank inspection, defect characterization, simulation, pattern compensation prior to mask patterning, modification of the mask writer database with compensated patterns designed to mitigate defects identified in the blanks, inspection and simulation of the reticles (patterned masks), and reticle repair after the mask has been patterned.

In another aspect, the improved EUV fabrication system performs blank inspection to identify defects at multiple focal planes within the blank. If the defect in the blank is so severe that the nominal (uncompensated) mask designed for the desired integrated circuit cannot be altered to compensate for the defect, the nominal mask can be relocated on the blank to avoid the defect. But when the defect in the blank is correctable, the nominal mask is altered to create a compensated mask designed to mitigate the defect identified in the blank prior to patterning the mask to create the reticle. Once the mask has been patterned to create the reticle, the reticle is inspected to identify any additional or remaining defects that were not picked up during blank inspection or fully mitigated through pattern compensation. The patterned reticle can then be repaired prior to integrated circuit fabrication with a reticle repair tool.

In another aspect, the EUV fabrication system can create a first reticle based on a nominal mask for the integrated circuit, a second reticle based on a compensated mask configured to mitigate a defect detected in the blank, and a third reticle repaired to mitigate a defect detected in a patterned reticle based on the nominal mask. In addition, the EUV fabrication system can create a fourth reticle based on an initially patterned reticle created using a compensated mask configured to mitigate a defect detected in the blank, and then further repair the initially printed reticle to mitigate an additional or remaining defect detected in the initially patterned reticle. Each of these techniques are employed, as appropriate, to mitigate defects in view of the severity of the defects to avoid errors in the integrated circuits, reduce the number of defective IC wafers fabricated, and improve the utilization of the EUV mask blanks.

In view of the foregoing, it will be appreciated that the present invention significantly improves upon prior defect mitigation technology for EUV integrated circuit fabrication. Specific structures and processes for implementing the invention, and thereby accomplishing the advantages described above, will become apparent from the following detailed description of the illustrative embodiments of the invention and the appended drawings and claims.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE PREFERRED EMBODIMENTS

Reference will now be made in detail to the subject matter disclosed, which is illustrated in the accompanying drawings. Referring generally to FIGS. 1 through 8, the present invention may be embodied in a method and system for extreme ultraviolet (EUV) lithographic integrated circuit wafer fabrication. The present EUV fabrication system includes tools needed to implement mask compensation to mitigate defects identified in the blank prior to reticle patterning. In addition, after the mask has been patterned to create the reticle, the reticle is inspected to identify any defects that were not picked up during inspection of the blank or fully mitigated through pattern compensation. The repair tool can then be used to repair any remaining defects identified in patterned reticle. Although multiple defects may be addressed in the fabrication, the defects may be described to in the singular for descriptive convenience.

Figure 1:
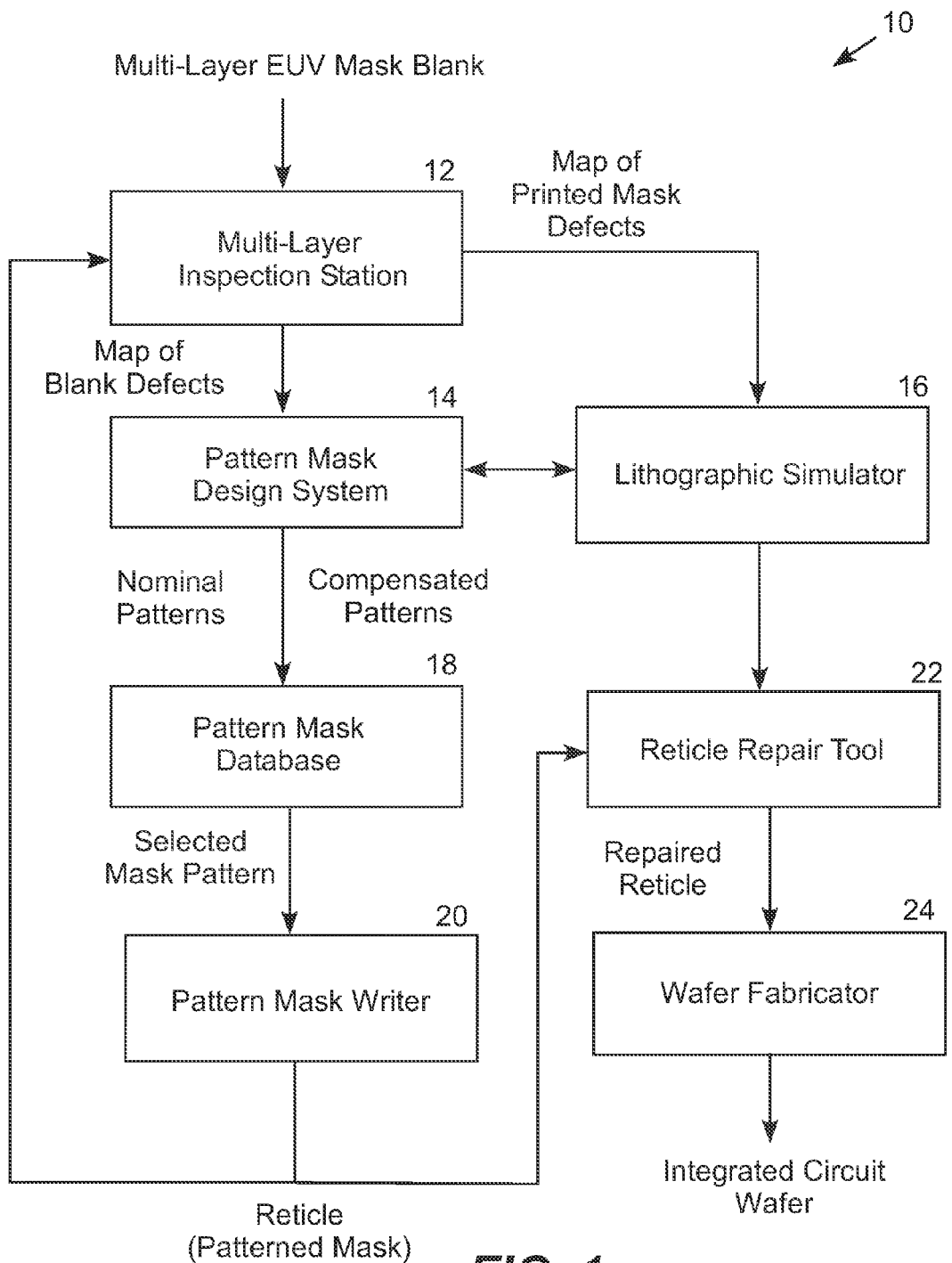
FIG. 1 is a functional block diagram of an EUV lithographic integrated circuit wafer fabrication system.

FIG. 1 is a functional block diagram of an EUV Fabrication System 10, in accordance with one embodiment of the present invention. In one aspect of the present invention, the Multi-Layer Inspection Station 12 may be used to inspect EUV mask blanks and patterned reticles at multiple focal planes. Although commonly available inspection stations operate at 193 nm, those skilled in the art will recognize that inspection technologies may be extended to operate in the EUV regime (e.g., 13.5 nm). As such, EUV based inspection systems may be configured to match the EUV wavelength used in lithographic processes, utilized to etch the patterns onto IC wafers. Methods and systems for inspecting EUV mask blanks and lithographic masks are generally described in U.S. Pat. No. 6,963,395 and U.S. Pat. No. 7,564,545 respectively, which are incorporated herein by reference. Further, the Pattern Mask Design System 14 may be used to design mask patterns for IC wafers. This includes the development of nominal (uncompensated) patterns for the desired IC circuits and the development of compensated patterns to work around defects in the blanks identified with in Inspection Station 12. The pattern mask design system 14 works in concert with the Lithographic Simulator 16 that simulates the operation of the mask patterns at 13.5 nm to determine the how the nominal and compensated patterns can be expected to operate in view of the defects identified by the Inspection Station 16. Once finalized, the compensated pattern is stored in the Pattern Mask Database 18. The Pattern Mask Writer 20 can then obtain a selected pattern from the Pattern Mask Database 18 and write the selected pattern onto an EUV mask blank to create a reticle (patterned mask).

In this particular embodiment, the EUV Fabrication System 10 advantageously follows up the reticle writing stage with inspection of the printed reticle with the Inspection Station 12 to identify any defects that may not have been picked up during blank inspection or fully mitigated through pattern compensation. The Lithographic Simulator 16 may once again be used to simulate the operation of IC wafers to be created with the reticle to determine whether any remaining defects identified in the printed reticle will likely cause errors in the IC wafers etched with the reticle. If a defect is identified in the printed reticle at this stage, repairs are proposed and simulated with the Lithographic Simulator 16 to determine an effective repair. Once an effective repair has been determined, the Pattern Repair Tool 22 implements the repair. The Wafer Fabricator 24 can then be used to etch the IC wafers using the repaired reticle.

Figure 2A:
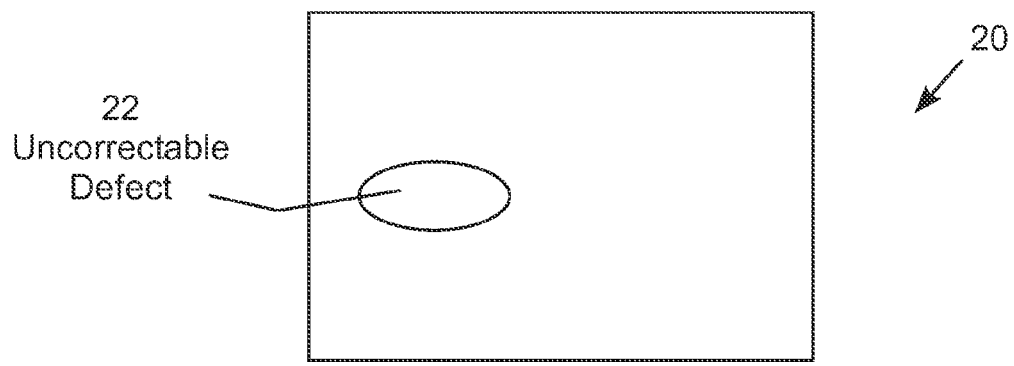
FIG. 2A is a conceptual illustration of an EUV mask blank containing an uncorrectable defect.
Figure 2B:
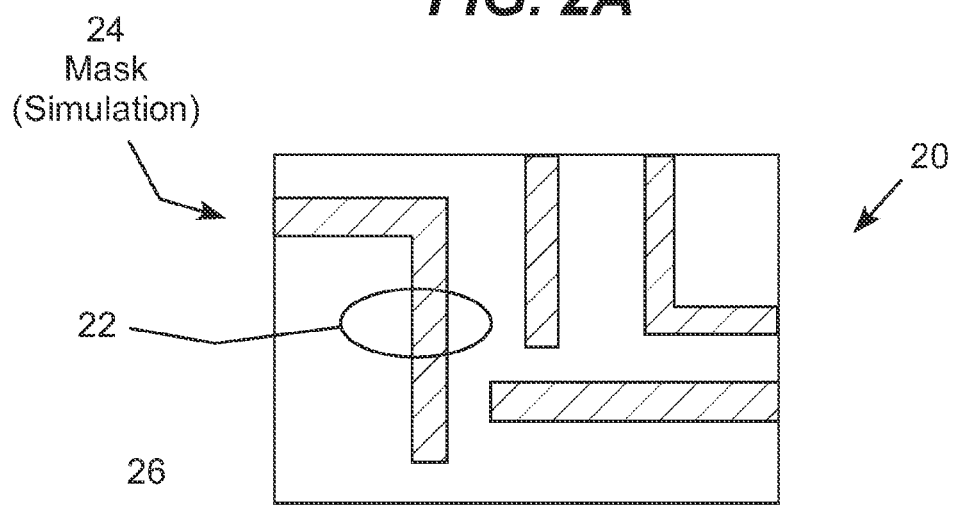
FIG. 2B is a conceptual illustration of a mask simulation positioned on the EUV mask blank containing the uncorrectable defect.
Figure 2C:
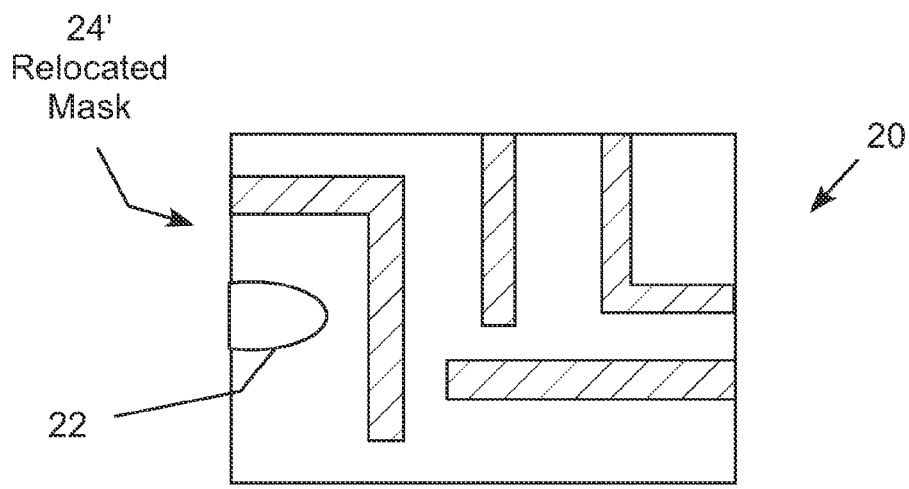
FIG. 2C is a conceptual illustration of a relocated mask positioned on the EUV mask blank to avoid the uncorrectable defect.

FIG. 2A is a conceptual illustration of an EUV mask blank 20 containing an uncorrectable defect 22, in accordance with one embodiment of the present invention. It is noted herein that FIGS. 2A-2C include hatched areas that represent absorber regions and blank (non-hatched) areas that represent reflective multilayer regions. In this example, the defect may include a phase defect that can be mitigated locating the defect entirely on the reflective multilayer region of the reticle. FIG. 2B is a conceptual illustration of a nominal (uncompensated) mask simulation 24 positioned on the EUV mask blank 20 containing the uncorrectable defect 20 with one of the absorber traces (a hatched area) overlying the defect 22. This defect is too large for compensation because the absorber traces cannot be readily altered to avoid the defect. To avoid this kind of defect, the mask is repositioned so that the absorber traces do not overly the defect. FIG. 2C is a conceptual illustration of the relocated mask 24' positioned on the EUV mask blank 20 to avoid the uncorrectable defect 22. While this approach is effective in mitigation the defect, it leads to waste of the EUV blank material because come portions of the EUV mask blank are unused for reticle fabrication. Likewise, if the traces defining the desired mask pattern are reflective rather than absorptive, the same technique may be used to locate the defect within the absorptive portion of the reticle to mitigate its effect. In this regard, the absorber material may be used to cover the defect in order to eliminate or reduce its effect.

Figure 3A:
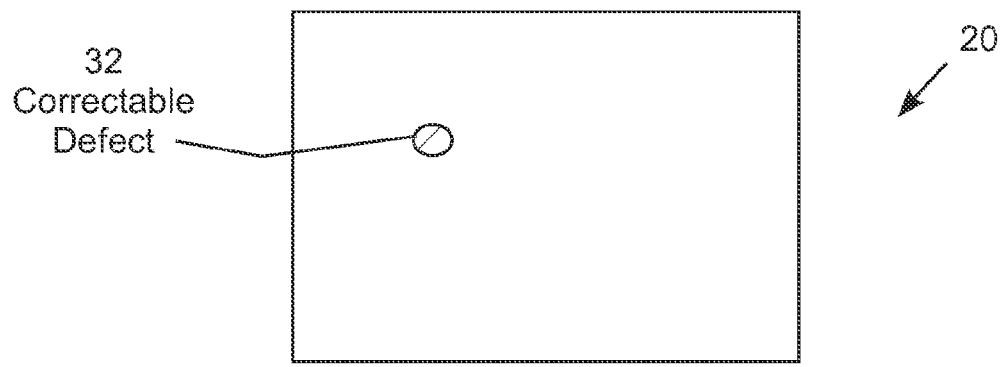
FIG. 3A is a conceptual illustration of an EUV mask blank containing a correctable defect.
Figure 3B:
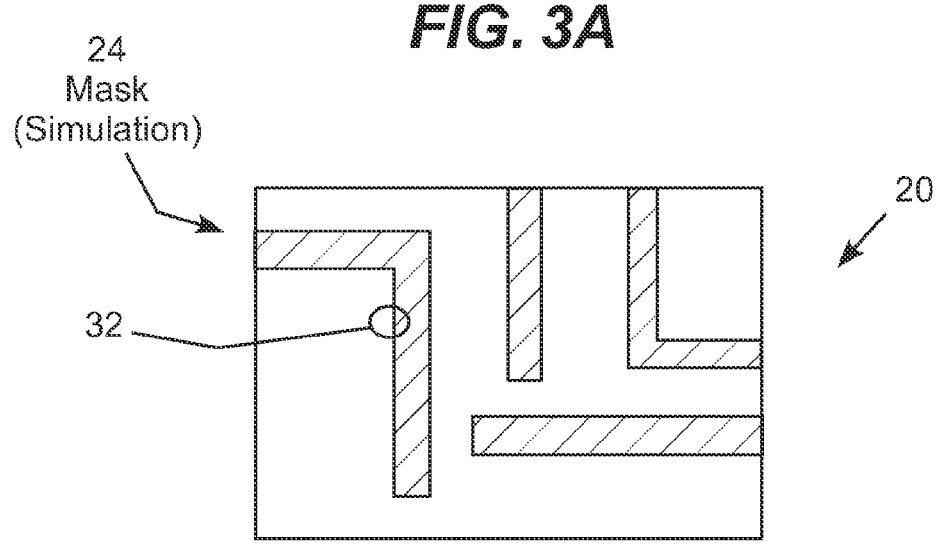
FIG. 3B is a conceptual illustration of a mask simulation positioned on the EUV mask blank containing the correctable defect.
Figure 3C:
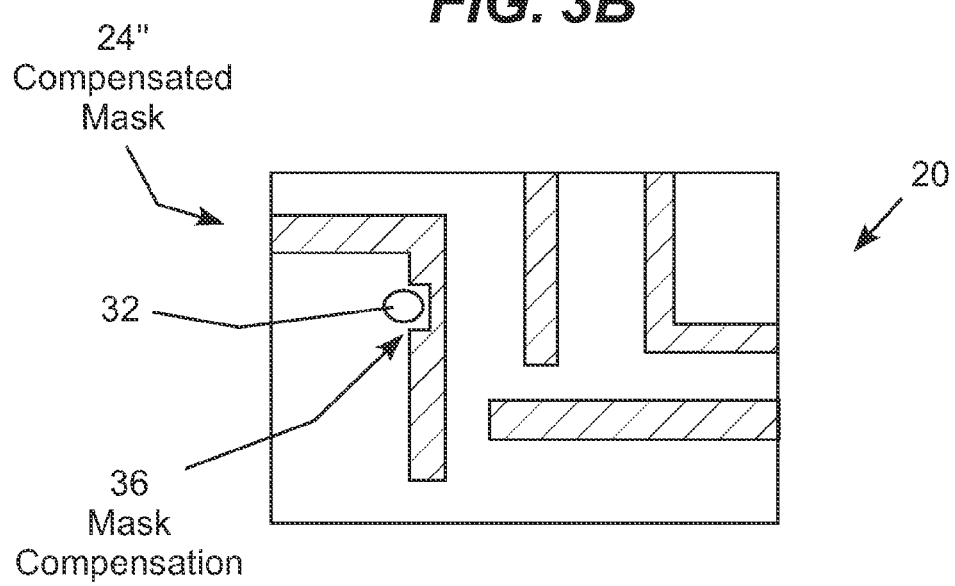
FIG. 3C is a conceptual illustration of a compensated mask designed to mitigate the correctable defect.

FIGS. 3A-3C illustrate conceptual illustrations of the EUV mask blank 20 containing a correctable defect 32, in accordance with embodiments of the present invention. To illustrate another aspect of the present invention, FIGS. 3A-3C include hatched areas that represent absorber regions and blank (non-hatched) areas that represent reflective multilayer regions. FIG. 3A is a conceptual illustration of the EUV mask blank 20 containing a correctable defect 32. FIG. 3B further illustrates a nominal mask simulation 24 positioned on the EUV mask blank 20 containing the correctable defect 32 with one of the absorber traces overlying the defect. Again in this example, the defect may include a phase defect that can be mitigated by locating the defect in the reflective region. This defect is small enough for compensation because the impacted absorber trace can be readily altered to avoid the defect. To mitigate this kind of defect, the impacted trace is altered so that the defect will be located entirely within the reflective region once the mask is printed, and the absorber traces will not exist over the defect. FIG. 3C is a conceptual illustration of the compensated mask 24" positioned on the EUV mask blank 20 with the absorber trace (hatched area) altered so that the correctable defect 32 does not impact the absorber trace. This type of mask compensation mitigates the impact of the defect without having to relocate the mask in order to minimize waste of the EUV blank material in the fabrication process. As in the previous example, if the traces defining the desired mask pattern are reflective rather than absorptive, the same technique may be used locate the defect within the absorber portion of the reticle to mitigate its effect.

Figure 4A:
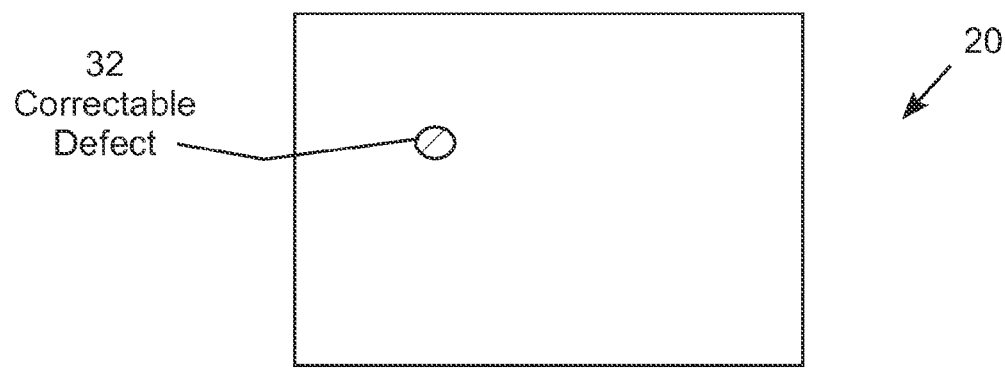
FIG. 4A is a conceptual illustration of an EUV mask blank containing another correctable defect.
Figure 4B:
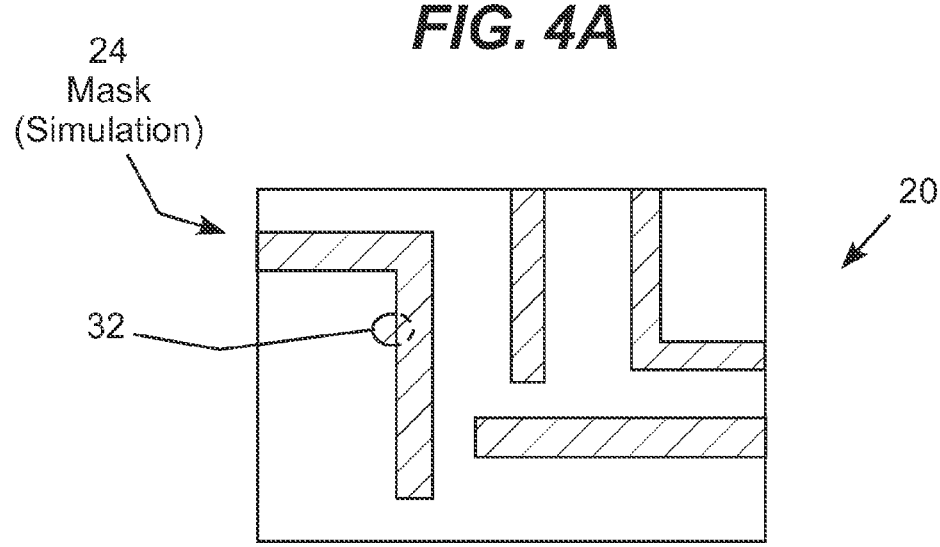
FIG. 4B is a conceptual illustration of a mask simulation positioned on the EUV mask blank containing the correctable defect.
Figure 4C:
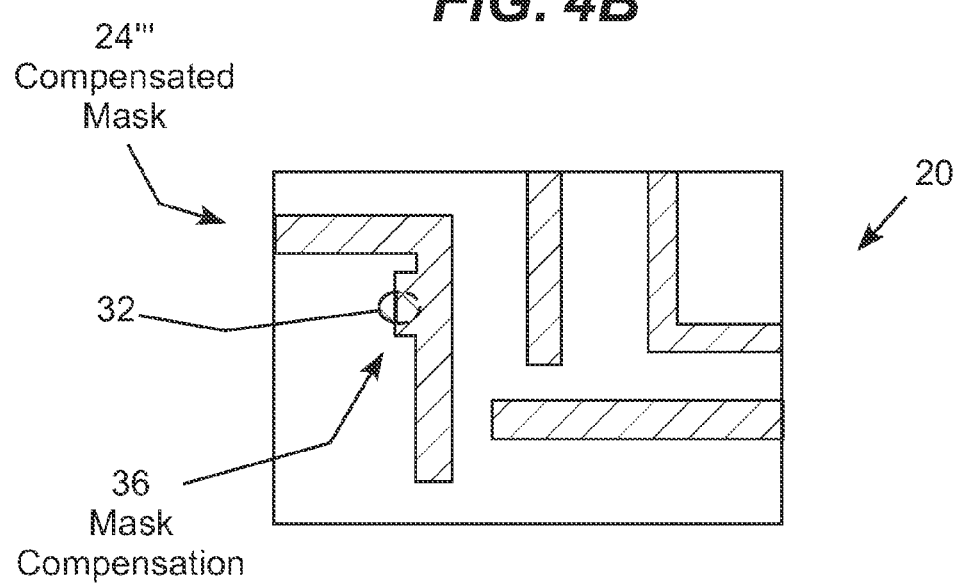
FIG. 4C is a conceptual illustration of a compensated mask designed to mitigate the correctable defect.

To illustrate yet another aspect of the present invention, FIGS. 4A-4C include hatched areas that represent absorber regions and the blank (non-hatched) areas represent reflective multilayer regions. In this example, however, the defect may be a phase defect that can be mitigated by locating the defect under the absorber. FIG. 4A is a conceptual illustration of the EUV mask blank 20 containing a correctable defect 32. FIG. 4B is a conceptual illustration of the nominal mask simulation 24 positioned on the EUV mask blank 20 containing the correctable defect 32 with one of the absorber traces overlying the defect. This defect is small enough for compensation because the impacted trace can be readily altered to mitigate the defect. To mitigate this kind of defect, the impacted trace is altered so that the defect will be entirely covered by the absorber (hatched area) once the mask is printed, and the reflective region (non-hatched area) will not overly the defect. FIG. 4C is a conceptual illustration of the compensated mask 24''' positioned on the EUV mask blank 20 with an absorber trace (hatched area) altered so that the correctable defect 32 is covered by the absorber. This type of mask compensations mitigates the defect without having to relocate the mask in order to minimize waste of the EUV blank material in the fabrication process. As in the previous examples, if the traces defining the desired mask pattern are absorptive rather than reflective, the same technique may be used locate the defect within the reflective portion of the reticle to mitigate its effect.

Figure 5A:
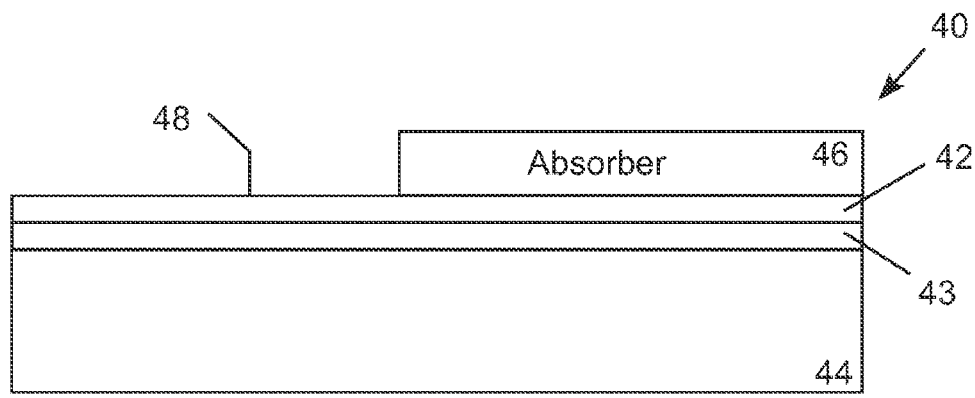
FIG. 5A is a conceptual illustration of patterned reticle.

FIG. 5A is a conceptual illustration of patterned reticle 40, which includes a multilayer 43 (e.g., Mo/Si multilayer) configured to reflect 13.5 nm light and a buffer film 42 formed on an LTE substrate 44, in accordance with one embodiment of the present invention. A mask pattern comprising an absorber 46 has been printed over the buffer 42 to define a reflective area 48. The absorber 46 typically corresponds to the desired image to be etched onto the IC wafer, while the reflective area 48 corresponds to areas on the wafer to be exposed to etch the desired pattern defined by the absorber onto the IC wafer. In some cases, a defect in the blank might not be picked up through inspection of the blanks or fully mitigated through pattern compensation, which leads to a defect in the reticle after patterning. A bump or a pit in the reflective trace as small as one nm can cause a phase defect significant enough to adversely impact IC wafers etched with the reticle.

Figure 5B:
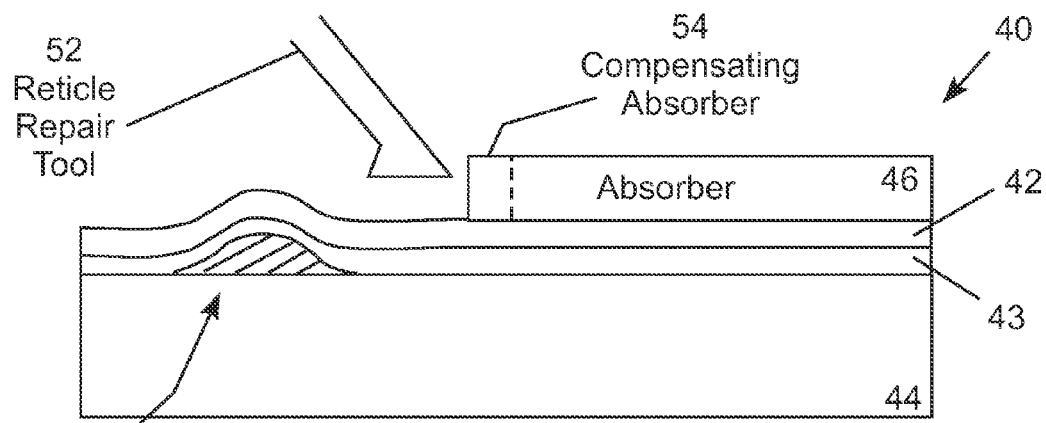
FIG. 5B is a conceptual illustration of the patterned reticle containing a reticle defect.
Figure 5C:
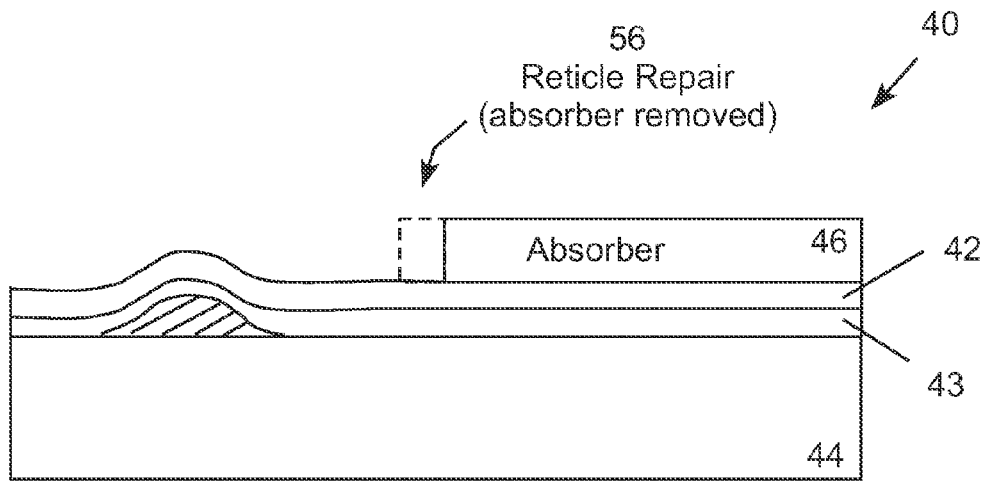
FIG. 5C is a conceptual illustration of the reticle after repair.

FIG. 5B is a conceptual illustration of the patterned reticle 40 containing this type of reticle defect 50 in the region of the reflective trace 48, in accordance with one embodiment of the present invention. Once the reticle defect 50 has been identified, a reticle repair tool 52 can be used in an attempt to repair the defect, which is effective in many cases. Again, this can be done by modifying the adjacent absorber pattern to compensate for the lithographic effect of the defect. In the conceptual illustration of FIG. 5B, the reticle defect 50 is a bump in the LTE substrate 44 underlying the multilayer 43 and the buffer 42 in the area of the defect. As one example, the reticle defect 50 can be mitigated by using the Reticle Repair Tool 52 to remove any absorber overlying the defect. This is illustrated in FIG. 5C, where any absorber above the defect 50 has been removed to locate the defect entirely within the reflective portion 48 of the reticle.

As another example, it may be possible to compensate for the defect 50 by removing a compensating portion of absorber 54 to expose additional multilayer to offset the effect of the defect. In this case, the reticle repair tool 52 may be used to remove a compensating portion of absorber 54 to produce the reticle repair 56 shown in FIG. 5C. Areas of missing or extra absorber may also be added or removed, as appropriate, to repair the reticle. In practice, all observed defects including all areas of misplaced, missing or extra absorber are repaired and the reticle is cleaned up to the extent possible prior to clearing the reticle for wafer fabrication.

Figure 6:
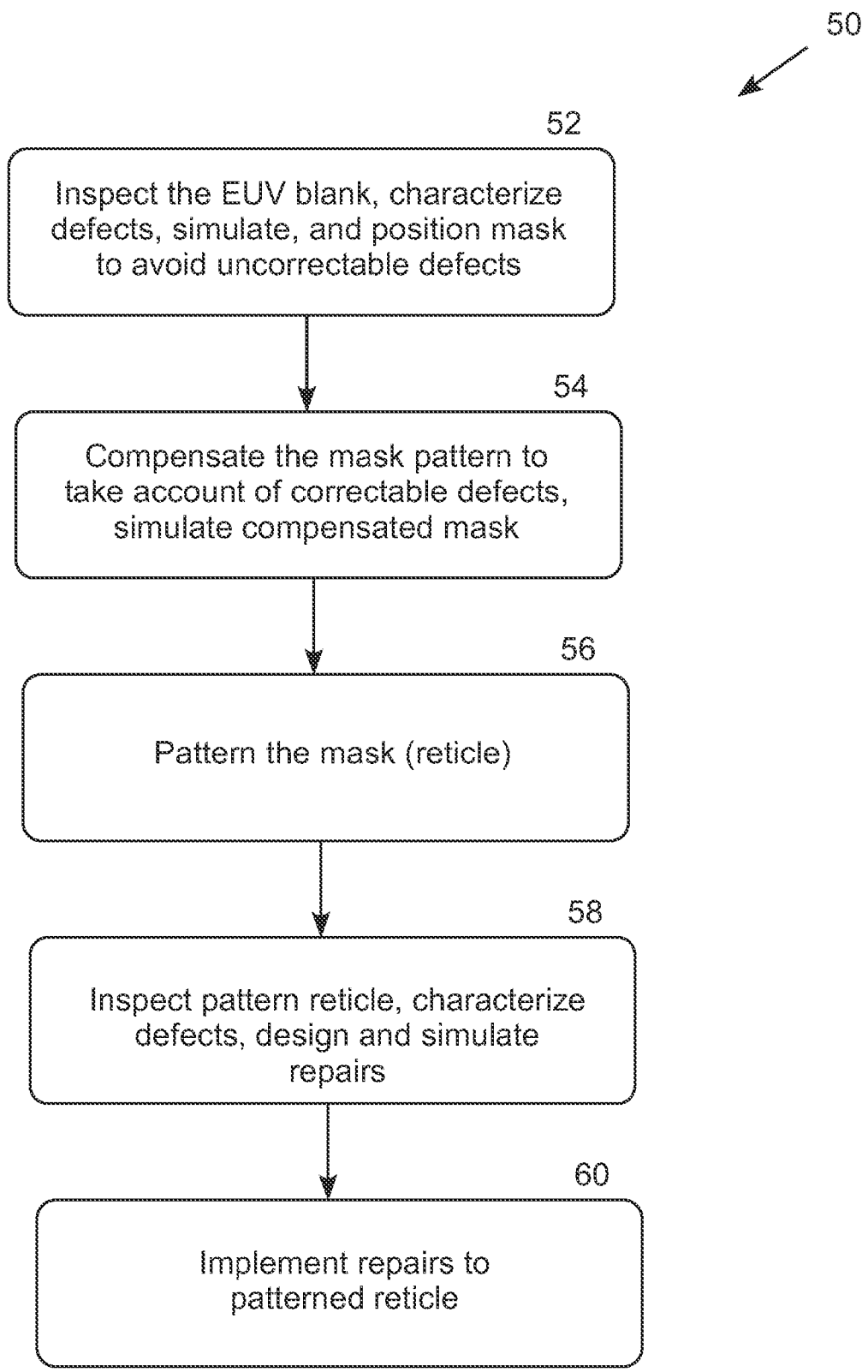
FIG. 6 is a summary level flow diagram illustrating the defect identification and mitigation features of the EUV lithographic integrated circuit wafer fabrication process of the present invention.

According to another aspect of the invention, FIG. 6 is a summary level flow diagram illustrating the defect identification and mitigation features 50 of the EUV Fabrication System 10. In step 52, EUV mask blanks are inspected at multiple levels. If no defects are identified, the procedure progresses directly to reticle patterning. But when defect is identified, it is characterized as to location, size and depth. A nominal mask pattern is simulated taking the defect into account to determine the expected impact of the defect on IC functionality. If the defect is too severe for correction, a different location for the pattern is determined to avoid the uncorrectable defect, as illustrated in FIGS. 2A-2C, and the procedure is starts anew for the pattern at a different location on the blank.

In the event that the defect can be corrected, step 52 is followed by step 54, in which a compensated pattern is developed to mitigate the defect, as illustrated in FIGS. 3A-3C and 4A-3C. The compensated mask is simulated to ensure that any proposed compensation is effective in avoiding or counteracting the effect of the defect. Once an effective compensated pattern has been developed, simulated and confirmed, step 54 is followed by step 56, in which the compensated patterned is saved in the pattern database and printed to create the reticle, which is also referred to as the patterned mask or patterned reticle.

Step 56 is followed by step 58, in which the patterned reticle is inspected to identify any defects that were not picked up during blank inspection or fully mitigated through pattern compensation. In one embodiment, pattern inspection may be performed utilizing an optical inspection tool, such as, but not limited to, an inspection tool configured for optical inspection in the UV regime (e.g., 193 nm or 13.5 nm). In another embodiment, pattern inspection may be performed utilizing an electron-beam inspection tool, such as, but not limited to, a scanning electron microscope. In the event a defect is identified, the patterned reticle is simulated to determine the potential effect of the defect on IC wafers etched with the reticle. If the defect could result in a potential in the IC wafer, repairs are proposed and simulated to determine an effective repair. Once an effective repair has been developed, simulated and confirmed, step 58 is followed by step 60, in which a repair tool is used to implement the repair on the printed reticle, as illustrated in FIGS. 5A-C. The reticle is then ready for IC wafer fabrication.

Figure 7:
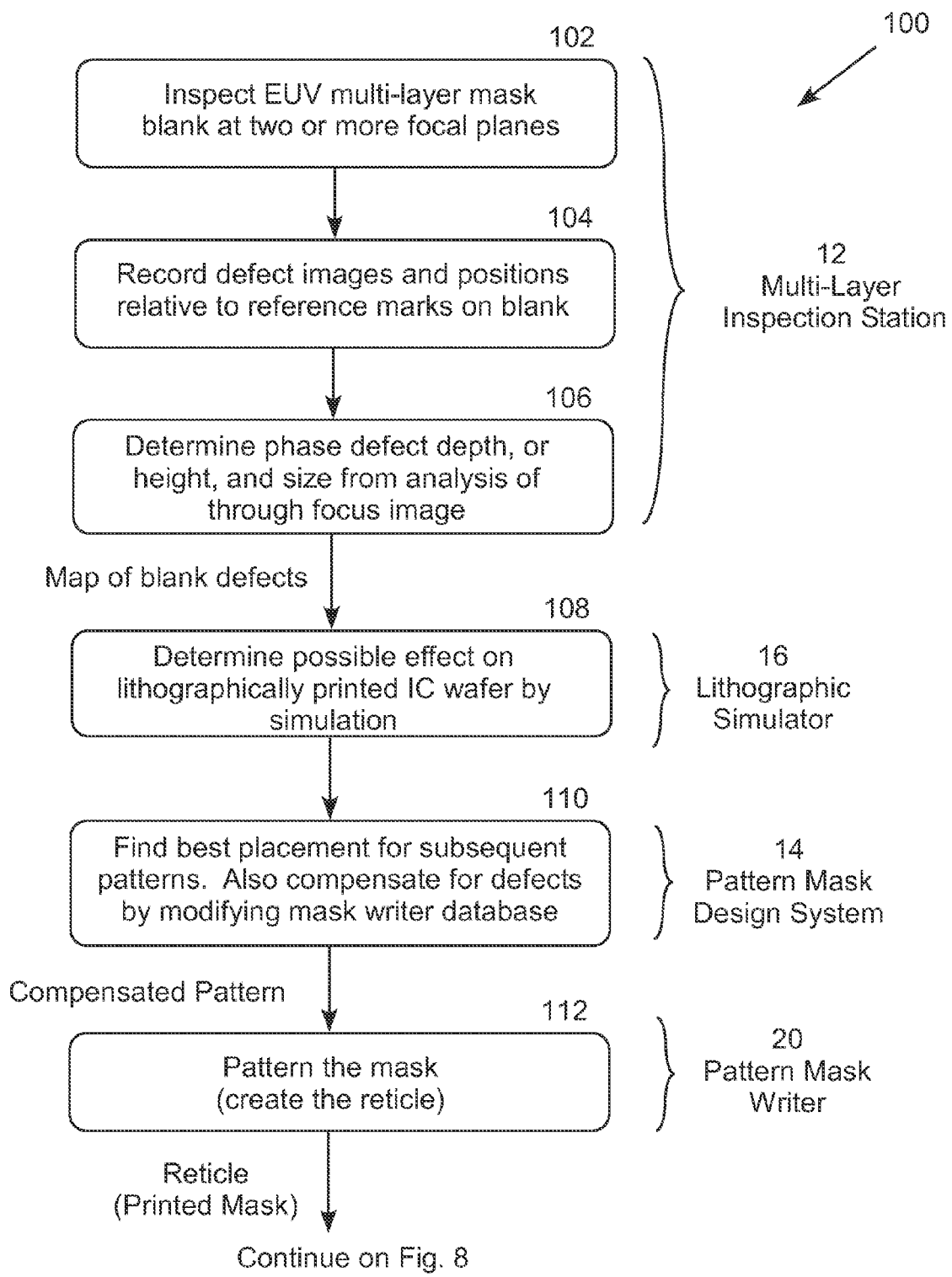
FIG. 7 is a more detailed flow diagram illustrating the EUV lithographic integrated circuit wafer fabrication process.

FIG. 7 is a more detailed flow diagram illustrating the EUV lithographic integrated circuit wafer fabrication process 100. Although a single defect will be described, is will be understood that multiple defects can be addressed in the procedure and that the procedure can proceed to IC wafer fabrication whenever a pattern has been sufficiently designed, inspected, simulated, compensated, and/or repaired to ensure error free IC wafer fabrication. In step 102, the EUV mask blank is inspected at multiple focal planes to identify a defect. Step 102 is followed by step 104, in which the defect image and position with respect to reference marks is recorded. Step 104 is followed by step 106, in which the image of the defect is analyzed to determine the depth, height, and size of the defect. The results of the blank inspection are compiled into the map of blank defects. Steps 102-106 are typically performed by the Multi-Layer Inspection Station 12.

Step 106 is followed by step 108, in which the nominal pattern for the desired IC is simulated in the presence of the defect as reflected in the map of blank defects. Step 108 is followed by step 110, in which alternate mask placement and compensation are developed and simulated to develop, simulate and confirm a compensated pattern. Steps 108-110 are typically performed by the Pattern Mask Design System 14 working in concert with the Lithographic Simulator 16. Once the compensated pattern has been adequately designed, simulated and confirmed, step 110 is followed by step 112, in which compensated pattern is stored in the Pattern Mask Database 18 and used by the Pattern Mask Writer 20 to print the patterned mask to create the reticle.

Figure 8:
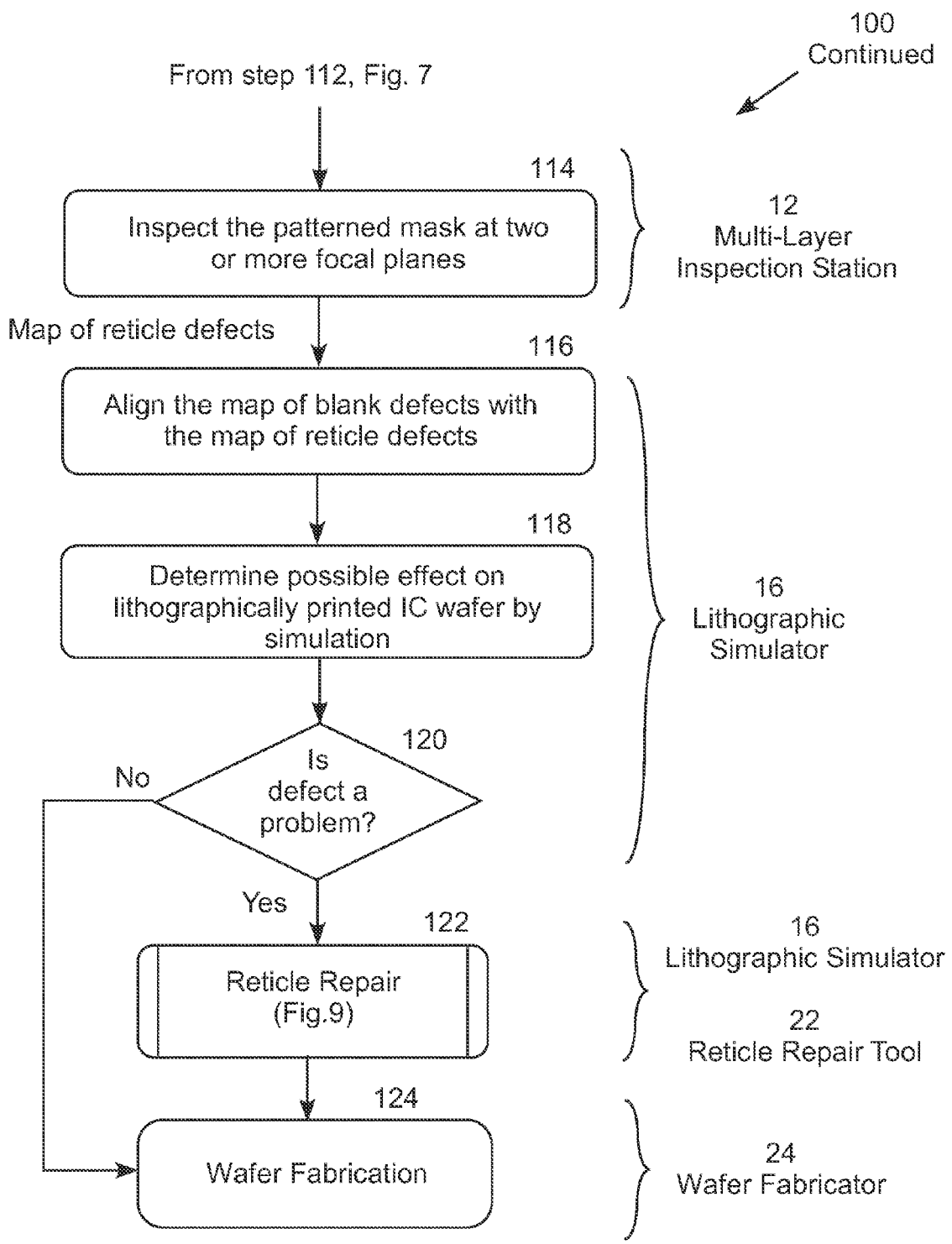
FIG. 8 continues the flow diagram of FIG. 7.

The EUV lithographic integrated circuit wafer fabrication process 100 continues on FIG. 8. Step 112 is followed by step 114, in which the Multi-Layer Inspection Station is again used, this time to inspect the printed reticle at multiple focal planes, to identify any defects that were not picked up during blank inspection or fully mitigated through pattern compensation. It is again noted that, in one embodiment, pattern inspection may be performed utilizing an optical inspection tool (e.g., inspection tool operating in UV regime). In another embodiment, pattern inspection may be performed utilizing an electron-beam inspection tool (e.g., SEM).

The inspect step of 114 results in a map of reticle defects. Step 114 is followed by step 116, in which the map of reticle defects is aligned with the map of blank defects to facilitate analysis and evaluation of the defect mitigation implemented by pattern compensation. Step 116 is followed by step 118, in which the printed reticle is simulated to determine the potential impact of the defect on the operation of IC wafers etched with the reticle. Step 118 is followed by step 120, in which the system determines whether the defect in the reticle can potentially cause an error in IC wafers etched with the reticle. If it is determined that the defect is not a problem, the "NO" branch is followed to step 124, where IC wafers are fabricated using the reticle. If it is determined that the defect could potentially cause an error in the IC wafers fabricated with the reticle, problem, the "YES" branch is followed to routine 122, in which the defect in the reticle is repaired, if possible. Steps 116-120 are typically performed by the Lithographic Simulator 16. Routine 120 for reticle repair is described in greater detail below with reference to FIG. 8.

Figure 9:
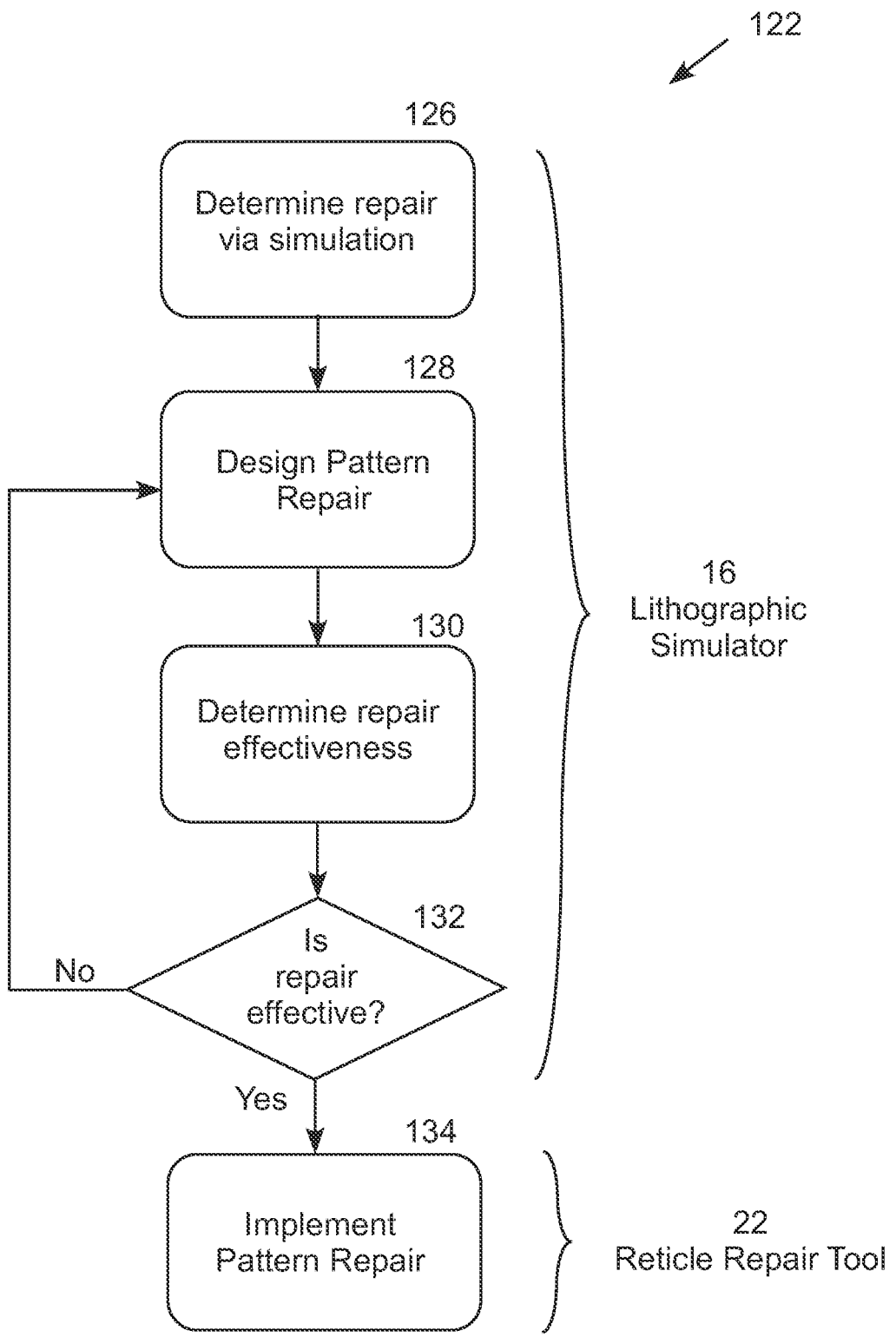
FIG. 9 is a flow diagram illustrating a method for reticle repair in the EUV lithographic integrated circuit wafer fabrication process.

FIG. 9 is a flow diagram Routine 120 for reticle repair, which is an expansion of step 118 shown on FIG. 8. In step 126, a potential repair for the reticle is developed by simulating the corrective effect of potential modifications to the reticle. Step 126 is followed by step 128, in which revised pattern is designed for the proposed repair. Step 128 is followed by step 130, in which repaired pattern is simulated to determine the effectiveness of the repair. Step 130 is followed by step 132, in which it is determined whether the proposed repair is effective. If the proposed repair is not effective, the "NO" branch loops back to step 128 for further development of a potential repair. If the simulation indicated that the proposed repair will be effective, the "YES" branch is followed from step 132 to step 134, where the repair is physically implemented on the reticle. Steps 126-132 are typically performed with the Lithographic Simulator 16, whereas the step 134 is performed with a specialized reticle repair tool.

The preceding description provides one illustrative method in which the present EUV fabrication system detects and corrects for defects in the blanks and patterned masks at several points within the fabrication process. First, the mask blank is inspected at multiple focal planes within the blank and a defect in the blank is identified and characterized as to location, size and depth. The nominal mask pattern is then simulated on the mask blank with the known defect to determine the potential effect of the defect on the operation of the circuit. If the defect is too severe for correction, the mask pattern is repositioned on the blank to avoid the defect. If the defect is correctable, the mask pattern is compensated to avoid or counteract the defect. The compensated pattern is simulated to ensure that acceptable circuit performance can be expected from the compensated pattern.

Once a compensated pattern has been designed and successfully simulated, the mask is patterned with the compensated mask to create the reticle. The pattern mask (reticle) is then inspected at multiple focal planes within the reticle to identify any defects that may not have been picked up during the blank inspection or fully mitigated through pattern compensation. If a remaining defect is identified, the pattern mask as affected by the defect in the reticle is simulated to determine the expected effect of the defect on a circuit created with the reticle. If the simulation indicates that the circuit is likely to be adversely affected by the defect, potential repairs may be designed and simulated. Once an effective repair has been developed and successfully simulated, the repair is implemented on the reticle (patterned mask) with a reticle repair tool.

As a result, the EUV fabrication system provides at least three opportunities for defect mitigation. First, the nominal mask may be positioned on the blank to avoid an uncorrectable defect in the blank. Second, the nominal mask pattern may be altered to create a compensated mask that avoids or counteracts a correctable defect in the blank. Third, the patterned mask (reticle) is inspected and any defects that were not picked up or adequately mitigated through pattern compensation prior to printing the pattern are repaired in the patterned reticle.

The defective regions in the EUV mask blank are usually small bumps or pits in the general range of 1 nm high, or deep, by 70 nm in width. These bumps and pits arise from defects on the mask blank low thermal expansion (LTE) substrate or in the materials deposited on the substrate. Light reflecting from these defects usually does not differ significantly in amplitude compared to the surrounding area, but it does differ significantly in optical phase. Thus, these defects are known as "phase defects." When an absorptive pattern is placed on the mask blank, these phase defects will optically interact with the pattern and may result in a defective device when etched lithographically on the IC wafer. Some of the phase defects will not produce a defective device whereas others will, depending on their properties and location relative to the absorber pattern. The task of the circuit designer is to determine which phase defects may be a problem and need to be repaired or compensated for, and then to implemented the most effective corrective action, which may involve repositioning the mask to avoid an uncorrectable defect, compensating the mask pattern to take into mitigate a correctable defect, and/or repairing the reticle after the mask has been patterned.

In order to accomplish this, the circuit designers use information relating to the phase defect size in all three dimensions. With this information and the location of the defect relative to the absorber pattern to be printed, a lithographic simulation program is used calculate the effect of the phase defect on the pattern to be printed on the wafer. Given this effect, the simulation program can be used to determine how the absorber pattern on the mask needs to be modified, either through pattern compensation implemented by the mask writer prior to patterning the mask or with a repair tool used to correct the reticle after the pattern has been written, in order to mitigate the effect of the defect on the wafer pattern.

Conventional defect mitigation technology is largely accomplished by positioning the mask on the blank to avoid the defects. This reduces the amount of the blank that can be used to produce reticles. Conventional technology also includes a reticle repair tool that can be used to alter a reticle after the mask has been patterned in an attempt to mitigate any defects identified in the patterned reticle. At present, however, there are no systems available for designing compensated masks to mitigate defects in the EUV mask blanks prior to patterning. The present invention provides these tools and combines mask compensation with additional aspects of defect identification and mitigation. The resulting procedure includes multiple application of inspection at multiple levels, both within the bank and within the patterned reticle, blank and reticle defect characterization, simulation, strategic placement of the mask, compensation of the mask to mitigate defects identified in EUV mask blanks, storing compensated mask patterns in the writer database, patterning nominal (uncompensated) and compensated masks, and patterned mask repair after the reticles have been printed.

The first step is to inspect the multi-layer mask blank using an inspection system that captures phase defects. One example of this type of system is described in PCT patent application WO 2010/147846, which is incorporated herein by reference. The commonly available systems use ultraviolet light of wavelength about 193 nm. It is contemplated herein that inspection methods may be extended to a wavelength of about 13.5 nm, which matches the EUV lithographic wavelength used to print patterns on the IC wafer. The inventive aspects of the present EUV fabrication system apply in either case.

The second step is to characterize the defect by analyzing its image captured at least two different focal planes. These images may be captured during the inspection step, for example, by imaging two fields on the detector, each field being at a different image focal plane. These images can also be captured by multiple scans of the same area of the mask at different focal positions. By analyzing the through-focus images, information about the defect size in three dimensions is obtained. There are several known methods to accomplish this, any of which may be employed in the present system. Further, accurate defect positions relative to reference marks on the mask blank are recorded for later use in the analysis.

The defect positions and sizes are then input into a patterned mask design program that determines the optimum placement and/or modifications of the absorber pattern in order to mitigate the negative effects of the defects in the blank. Allowing only placement change of absorber pattern to mitigate the effects of defects, as employed by the conventional technology, is effective only in cases where the number of phase defects is small. Modifying the shape of the absorber pattern to compensate for the phase defects can potentially work with larger number of defects to improve the utilization of the blanks.

The third step involves repair of the reticle after the absorber material has been patterned. Here the reticle, now patterned with the mask, is inspected for defects in the absorber pattern. The map of defects in the blank is typically superimposed and aligned with the image of the reticle to assist in identification of additional defects or defects that were not adequately mitigated through pattern compensation. Using the previous information about phase defect location and size from the blank inspection step, additional defects can be identified and characterized even though they were not detected in the mask blank inspection step. In order to determine if the phase defects identified in the need to be repaired, a lithographic simulation step may again be employed.

Alternatively or additionally, an aerial imaging system (AIMS) operating at the lithography wavelength may be used to determine if the defect possibly results can be expected to result in an error in the printed pattern on the wafer. If an AIMS tool operating at about 13.5 nm is not available to directly image the reticle, then the simulation at 13.5 nm is typically used as a surrogate. Currently there are no inspection or AIMS systems that operate at the EMT wavelength of 13.5 nm. For this reason, inspection with a wavelength of about 193 nm is employed in combined with a lithographic simulation at 13.5 nm. The patterned mask inspection results are combined with the blank inspection results to assist in evaluation of the mitigation implemented through pattern compensation.

In one embodiment, this combination consists of the following specific steps comparing the defect maps of the blank and patterned mask inspection results. The defects maps from the blank inspection and the patterned mask inspection are overlaid such that phase defects detected in both inspections match in coordinates. From the blank inspection defect map those phase defects that are not seen in the patterned mask inspection can be located relative to the pattern. For each phase defect, a lithographic simulation is run to determine if the defect is expected to produce an error in the pattern printed on the wafer. If an error is predicted, then the simulation proposes a modification of the pattern on which a repair can be made by a repair tool. The quality of the proposed repair is confirmed by obtaining an image of the proposed repair and running the lithography simulator again. Once the effectiveness of the proposed repair has been confirmed through simulation, the repair is implemented on the patterned reticle with the repair tool.

One problem in detecting defects in the printed reticle is that a 193 nm inspection can only see the mask surface or near surface, whereas the 13.5 nm lithography system is affected by the deeper multi-layer structure around the defect. However, once a manufacturing process for a multi-layer blank has been established, the multi-layer structure around a defect will be relatively well-known. There may be two or three multi-layer defect models that can be used in the 13.5 nm lithographic simulation. Those skilled in the art will understand that the models may be refined as experience with the technology develops.

The combination of these several techniques into a method for mitigating the effects of phase defects in EUV patterned masks results in more efficient utilization of blanks arising from the ability to compensate for certain defects as opposed to placing the masks around all of the identified defects. In addition, the second level of reticle inspection and repair prior to IC fabrication results in the fabrication of far fewer defective IC wafers.

All of the system and methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

In view of the foregoing, it will be appreciated that present invention provides significant improvements in defect identification and mitigation in EUV integrated circuit fabrication. Those skilled in the art will understand the many modifications and adaptations of the specific methods and systems described above may be implemented within the spirit and scope of the invention as defined by the following claims.

The invention claimed is:

1. A method for manufacturing integrated circuit wafers with an extreme ultraviolet lithographic (EUV) fabrication system, comprising the steps of:
   obtaining an EUV mask blank;
   locating a nominal mask on an area of the blank, the nominal mask comprising a pattern configured for printing an absorber to create absorptive traces on the blank for creating a reticle for etching an integrated circuit onto one or more wafers;
   inspecting the blank in the area of the nominal mask at multiple focal planes within the blank;
   identifying a defect in the blank in the area of the nominal mask;
   characterizing the defect as to size and location;
   mapping the defect to create a defect map for the blank;
   simulating the integrated circuit using the nominal mask and the defect map for the blank;
   designing a compensated mask to mitigate the effect of the defect in the blank;
   simulating the integrated circuit using the compensated mask and the defect map for the blank;

printing the compensated mask on the blank to create a reticle.

2. The method of claim 1, further comprising the step of etching the integrated circuit onto one or more wafers using the reticle.

3. The method of claim 1, further comprising the steps of:
inspecting the reticle at multiple focal planes;
identifying, characterizing and mapping a defect in the reticle to create a defect map for the reticle;
simulating the integrated circuit using the compensated mask and the defect map for the reticle;
designing a proposed reticle repair to mitigate the defect in the reticle;
simulating the integrated circuit using the proposed reticle repair and the defect map for the reticle; and
repairing reticle.

4. The method of claim 3, further comprising the step of etching the integrated circuit onto one or more wafers using the repaired reticle.

5. The method of claim 1, wherein the step of identifying, characterizing and mapping the defect in the reticle to create a defect map for the reticle further comprises the step of aligning the defect map for the blank with the defect map for the reticle to assist in identifying the defect in the reticle.

6. The method of claim 1, wherein the step of inspecting the blank is performed at about 193 nm.

7. The method of claim 1, wherein the step of inspecting the blank is performed at about 13.5 nm.

8. The method of claim 1, wherein the step of simulating the integrated circuit is performed at about 13.5 nm.

9. The method of claim 1, wherein the step of characterizing the defect in the blank further comprises identifying a location, depth or height, and size for the defect in the blank.

10. The method of claim 1, wherein the step of characterizing the defect in the reticle further comprises identifying a location, depth or height, and size for the defect in the reticle.

11. The method of claim 1, further comprising the steps of:
obtaining a second EUV mask blank;
locating the nominal mask on an area of the second blank;
inspecting the second blank in the area of the nominal mask at multiple focal planes within the second blank;
identifying, characterizing and mapping a defect in the second blank in the area of the nominal mask to create a defect map for the second blank;
simulating the integrated circuit using the nominal mask and the defect map for the second blank;
determining that the defect in the second blank printed with the nominal mask is not expected to cause an error in the integrated circuit and printing the nominal mask on the blank to create a reticle;
printing the nominal mask on the second blank to create a second reticle;
inspecting the second reticle at multiple focal planes;
identifying, characterizing and mapping a defect in the second reticle to create a defect map for the second reticle;
simulating the integrated circuit using the nominal mask and the defect map for the second reticle;
designing a proposed reticle repair to mitigate the defect in the second reticle;
simulating the integrated circuit using the proposed reticle repair and the defect map for the second reticle;
repairing second reticle; and
etching the integrated circuit onto one or more silicon wafers using the repaired second reticle.

12. The method of claim 1, further comprising the steps of:
obtaining a third EUV mask blank;
locating the nominal mask on an area of the third blank;
inspecting the third blank in the area of the nominal mask at multiple focal planes within the third blank;
identifying, characterizing and mapping a defect in the third blank in the area of the nominal mask to create a defect map for the third blank;
simulating the integrated circuit using the nominal mask and the defect map for the third blank;
determining that the defect in the third blank printed with the nominal mask is not expected to cause an error in the integrated circuit and printing the nominal mask on the blank to create a reticle;
printing the nominal mask on the third blank to create a third reticle;
inspecting the third reticle at multiple focal planes;
identifying, characterizing and mapping a defect in the third reticle to create a defect map for the third reticle;
simulating the integrated circuit using the nominal mask and the defect map for the third reticle;
determining that the defect in the third reticle is not expected to cause an error in the integrated circuit; and
etching the integrated circuit onto one or more silicon wafers using the third reticle.

13. The method of claim 1, further comprising the steps of:
obtaining a fourth EUV mask blank;
locating the nominal mask on an area of the fourth blank;
inspecting the fourth blank in the area of the nominal mask at multiple focal planes within the fourth blank;
identifying, characterizing and mapping a defect in the fourth blank in the area of the nominal mask to create a defect map for the fourth blank;
simulating the integrated circuit using the nominal mask and the defect map for the fourth blank;
designing a second compensated mask to mitigate the effect of the defect in the fourth blank;
simulating the integrated circuit using the second compensated mask and the defect map for the fourth blank;
printing the second compensated mask on the fourth blank to create a fourth reticle;
inspecting the third fourth at multiple focal planes;
identifying, characterizing and mapping a defect in the fourth reticle to create a defect map for the fourth reticle;
simulating the integrated circuit using the second compensated mask and the defect map for the fourth reticle;
determining that the defect in the fourth reticle is not expected to cause an error in the integrated circuit; and
etching the integrated circuit onto one or more silicon wafers using the fourth reticle.

14. An EUV integrated circuit fabrication system comprising:
a multi-layer inspection station configured for imaging an EUV mask blank at multiple focal planes within the blank, identifying and characterizing a defect in the blank, and creating a map of the defect in the blank;
a pattern mask design system configured for designing a nominal mask for printing a reticle for etching an integrated circuit;
a lithographic simulator configured for simulating an integrated circuit based on the nominal mask and the map of the defect in the blank;
the pattern mask design system further configured for designing a modification to the nominal mask to create a compensated mask for mitigating the defect in the blank;
the lithographic simulator further configured for simulating the integrated circuit based on the nominal mask and the map of the defect in the blank;

a pattern mask data base configured for storing the nominal mask and the compensated mask;

a pattern mask writer configured for printing an absorber to create traces on the blank corresponding to the compensated mask for creating a reticle for etching an integrated circuit onto one or more wafers; and a wafer fabricator configured for etching the integrated circuit onto one or more wafers using the reticle.

15. The system of claim 14, further comprising a reticle repair tool configured for altering reticles to create repaired reticles, and wherein:

the multi-layer inspection station further configured for imaging the reticle at multiple focal planes within the reticle, identifying and characterizing a defect in the reticle, and creating a map of the defect in the reticle;

the lithographic simulator further configured for simulating the integrated circuit based on the compensated mask and the map of the defect in the reticle and defining a proposed repair to the reticle to mitigate the defect in the reticle;

the lithographic simulator further configured for simulating the integrated circuit based on the proposed repair to the reticle and the map of the defect in the reticle;

the reticle repair tool configured for altering the reticle based on the proposed repair to create a repaired reticle; and the wafer fabricator is further configured for etching the integrated circuit onto one or more silicon wafers using the repaired reticle.

16. The system of claim 14, wherein the lithographic simulator is further configured for aligning the defect map for the blank with the defect map for the reticle to assist in identifying the defect in the reticle.

17. The system of claim 14, wherein the multi-layer inspection station is further configured to operate at about 193 nm.

18. The system of claim 14, wherein the multi-layer inspection station is further configured to operate at about 13.5 nm.

19. The system of claim 14, wherein the lithographic simulator is further configured to simulate the integrated circuit at about 13.5 nm.

20. The system of claim 14, wherein the multi-layer inspection station is further configured to characterize the defect in the blank as to location, depth or height, and size for the defect in the blank.

21. The system of claim 14, wherein the multi-layer inspection station is further configured to characterize the defect in the reticle as to location, depth or height, and size for the defect in the reticle.

22. An EUV integrated circuit fabrication system configured to:

create a first reticle based on a nominal mask for an integrated circuit; and create a second reticle based on a compensated mask configured to mitigate a defect detected in the blank.

23. The system of claim 22, further configured to repair a reticle initially patterned with the nominal mask to create a third reticle repaired to mitigate a defect detected in a patterned reticle.

24. The system of claim 22, further configured to:

create a fourth reticle based on an initially patterned reticle created using a compensated mask configured to mitigate a defect detected in the blank; and repair the initially patterned reticle to create a repaired reticle mitigating a defect detected in the initially patterned reticle.

* * * * *